United States Patent [19]
Farooq et al.

[11] Patent Number: 5,787,578
[45] Date of Patent: Aug. 4, 1998

[54] METHOD OF SELECTIVELY DEPOSITING A METALLIC LAYER ON A CERAMIC SUBSTRATE

[75] Inventors: Shaji Farooq; Suryanarayana Kaja; John U. Knickerbocker, all of Hopewell Junction; Brenda Peterson, Wappingers Falls; Srinivasan N. Reddy, Lagrangeville; Rao V. Vallabhaneni, Wappingers Falls; Donald R. Wall, Poughkeepsie, all of N.Y.

[73] Assignee: International Business Machines Corporation, Armonk, N.Y.

[21] Appl. No.: 677,257

[22] Filed: Jul. 9, 1996

[51] Int. Cl.⁶ .................................................. H01R 9/00
[52] U.S. Cl. .............................. 29/843; 29/851; 428/552
[58] Field of Search .................. 29/843, 851; 264/402, 264/442, 443

[56] References Cited

U.S. PATENT DOCUMENTS

| | | | |
|---|---|---|---|
| 4,340,618 | 7/1982 | Fury et al. | 29/851 |
| 4,442,137 | 4/1984 | Kumar | 427/57 |
| 4,493,856 | 1/1985 | Kumar et al. | 427/57 |
| 4,504,322 | 3/1985 | Adwalpalker et al. | 134/1 |
| 4,582,722 | 4/1986 | Herron et al. | 427/57 |
| 4,599,277 | 7/1986 | Brownlow | 428/552 |
| 4,786,674 | 11/1988 | Herron et al. | 524/315 |
| 5,260,519 | 11/1993 | Knickerbocker et al. | 174/262 |

OTHER PUBLICATIONS

A. H. Kumar and K. V. Srikrishnan, Maskless Capping of Molybdenum Features on Alumina Substrates, IBM Technical Disclosure Bulletin, Jan. 1983, vol. 25, No. 8, p. 4414.

*Primary Examiner*—Carl J. Arbes
*Attorney, Agent, or Firm*—Ira D. Blecker

[57] ABSTRACT

Disclosed is a method of selectively depositing a metallic layer on a metallic feature on a ceramic substrate. The metallic layer preferably may be elemental nickel particles, elemental copper particles, a mixture of copper and nickel particles, or copper/nickel alloy particles. The metallic layer is deposited as a paste mixture which includes the metallic particles and a binder material. Through a subsequent heating step, the metallic layer tightly bonds to the metallic feature but only loosely bonds to the ceramic substrate. Thereafter, an ultrasonic treatment is applied to remove the loosely adhered metallic layer on the ceramic substrate. The metallic layer on the metallic feature, being tightly bonded, is not removed by the ultrasonic treatment.

19 Claims, 3 Drawing Sheets

ANNEAL

ULTRASONIC

SINTERED CERAMIC WITH METALLIC FEATURE

SPRAY, SCREEN OR PAINT METAL

ANNEAL

ULTRASONIC

METHOD OF SELECTIVELY DEPOSITING A METALLIC LAYER ON A CERAMIC SUBSTRATE

BACKGROUND OF THE INVENTION

The present invention relates to a method of depositing metallic layers on an existing metallurgy pattern on a supporting dielectric substrate, and more particularly, for depositing thick film metallic layers on metal conductive patterns on ceramic substrates employed for mounting semiconductor devices thereon.

In the fabrication of multi-layer ceramic (MLC) substrates for use in semiconductor packages, a mixture of ceramic particles, a resin binder, and a solvent for the binder is doctor bladed into thin sheets and then dried. The resultant green ceramic sheets are punched to form via holes, the via holes filled and circuit patterns imprinted with a conductive paste, the sheets assembled into a laminated structure and the resultant substrate sintered to burn away the binder the solvent and fuse the ceramic particles. After the sintering operation, metallurgy patterns are formed on the top and bottom surface to make contact with and support suitable input/output (I/O) connections. These connections are used to make electrical connections to semiconductor devices, normally on the top surface, and connections to a supporting board, card or other support on the bottom surface. The internal metal of the substrate must withstand the high temperature sintering operation. This normally requires the use of a refractory metal. However, these refractory metals cannot be conveniently bonded to I/O and device elements by solder and brazing techniques. What is commonly done is depositing additional metallurgy patterns of metals that are solderable and compatible with brazing operations over the refractory metal vias and patterns. Even where relatively low temperature sintered ceramics are used with non-refractory metals, it may be desirable to add additional metallurgy for improved bonding or other purposes.

However, during the sintering operation, the green ceramic substrate shrinks substantially, usually on the order of 15 to 20%. Unfortunately, the shrinkage is not always uniform resulting in a distorted pattern of metal vias and other patterns on the sintered substrate surface. When the geometry of the sintered metal pattern is small, the subsequent metallurgy pattern cannot be deposited by conventional evaporation through a mask. The distortion occurring during sintering thus precludes mask alignment to the pattern.

In order to apply the necessary non-refractory metal layers over the metal areas on a substrate, the metals may be conventionally deposited by electroless plating or electroplating which do not require masks. However, coatings formed by electroless platings may contain impurities such as phosphorous, boron, etc. which may be objectionable in subsequent joining. Electroplating requires electrical connection to each area to be plated, whereas in MLC substrates such connections are not always available, since some pads or portions of the metallurgy pattern can be "electrically floating".

Others have proposed maskless methods of depositing non-plated coatings on ceramic substrates having molybdenum metallurgy. Kumar et al. IBM Technical Disclosure Bulletin, 25, No. 8, p. 4414 (January 1983), the disclosure of which is incorporated by reference herein, have proposed depositing, e.g., by evaporation, two layers of metal where the bottom layer melts during heat treatment but the top layer does not. The primary requirement is that the bottom layer should wet the molybdenum but not the ceramic while the bottom layer is in the liquid state. Thereafter, an ultrasonic treatment is applied to remove the metallic coating from the ceramic but not from the molybdenum.

In Kumar U.S. Pat. No. 4,442,137, the disclosure of which is incorporated by reference herein, there is disclosed a maskless technique for deposition of a metal coating on a substrate wherein a metal is blanket coated, e.g., by vacuum deposition, sputtering and the like, followed by a heat treatment to diffuse the metal into the patterned underlying metal, cooling, and then ultrasonically treating the substrate to remove the metal from the ceramic portion of the substrate.

Adwalpalker et al. U.S. Pat. No. 4,504,322, the disclosure of which is incorporated by reference herein, is similar to Kumar '137 except the blanket layer of metal is electrolessly deposited. Herron et al. U.S. Pat. No. 4,582,722, the disclosure of which is incorporated by reference herein, is similar to Kumar '137 except that a protective layer is applied to shield certain areas from deposition of the blanket layer of metal.

A difficulty with the method of deposition proposed by Kumar '137 and Herron et al. is that sputtering and like methods increase the adhesion of the blanket deposited layer to the ceramic, thereby making the blanket deposited layer more difficult to remove. As noted above, electroless coatings as proposed by Adwalpalker et al. can introduce undesirable impurities into the coating.

Accordingly, it is a purpose of the present invention to have an improved process for depositing a patterned layer of metallurgy.

It is a further purpose of the present invention to have an improved process for depositing a patterned layer of metallurgy which does not rely on plating, vacuum deposition or sputtering for deposition of the blanket layer of metallurgy.

These and other purposes of the invention will become more apparent after referring to the following description considered in conjunction with the accompanying Figures.

BRIEF SUMMARY OF THE INVENTION

One aspect of the invention relates to a method of selectively depositing a metallic layer on at least one metallic feature on a ceramic substrate, the method comprising the steps of:

blanket coating a layer of a metallic mixture on said ceramic substrate and said at least one metallic feature, said metallic mixture comprising metallic material and a binder material;

heating said coated ceramic substrate to diffusion bond said metallic material of said metallic mixture to said at least one metallic feature, said metallic material being loosely bonded to said ceramic substrate;

cooling said coated ceramic substrate; and ultrasonically removing said metallic material from said ceramic substrate but not from said at least one metallic feature, thereby resulting in a layer of metallic material being selectively deposited only on said at least one metallic feature.

A second aspect of the invention relates to a method of selectively depositing a metallic layer on at least one metallic feature on a ceramic substrate, the method comprising the steps of:

blanket coating a layer of a metallic mixture on anunsintered ceramic body having at least one metallic feature;

sintering said coated ceramic body so that said ceramic body, said at least one metallic feature and said metallic mixture densify into a ceramic substrate having metallic material of said metallic mixture bonded to said at least one metallic feature and loosely bonded to said ceramic substrate;

cooling said ceramic substrate; and ultrasonically removing said metallic material from said ceramic substrate but not from said at least one metallic feature, thereby resulting in metallic material selectively deposited only on said at least one metallic feature.

DETAILED DESCRIPTION OF THE INVENTION

Turning to the Figures in more detail, and particularly referring to FIGS. 1, there is shown a prior art maskless method of depositing a patterned layer of metallurgy on a ceramic substrate. As shown in FIG. 1A, it is desired to deposit a patterned layer of metallurgy on patterned ceramic substrate 10 which comprises a sintered ceramic body 12 having a metallic feature 16 and optionally at least one via 14. For purposes of illustration, the ceramic body is alumina and the metallic feature 16 and optional via 14 are a refractory metal, such as molybdenum.

Figure 1A:
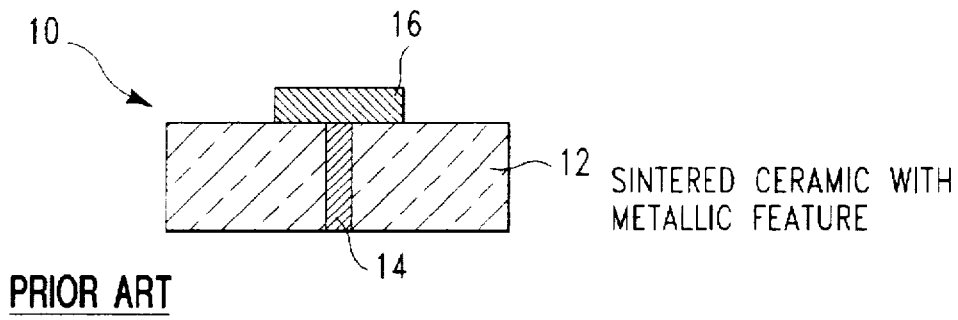
FIGS. 1A, 1B, 1C and 1D schematically illustrate a prior art maskless method of depositing a patterned layer of metallurgy on a ceramic substrate.
Figure 1B:
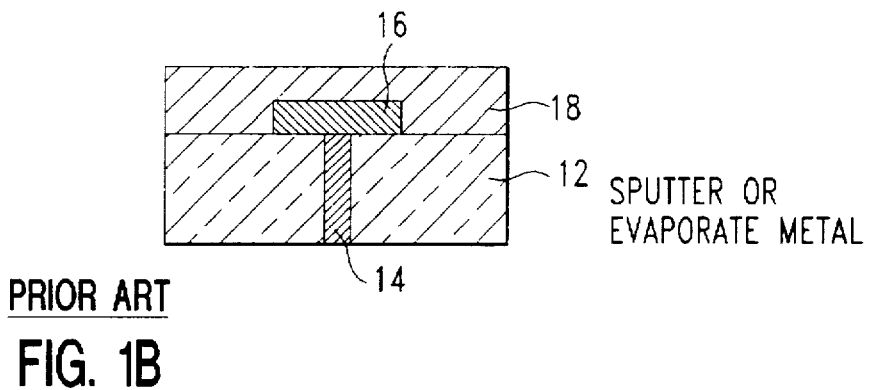

It is desired to place a layer of, for example, nickel on the molybdenum. According to the prior art, a layer of nickel 18 is blanket deposited, such as by evaporation or sputtering, on the ceramic substrate 10. As can be seen in FIG. 1B, the layer of nickel 18 covers the ceramic body 12 as well as the metallic feature 16.

Figure 1C:
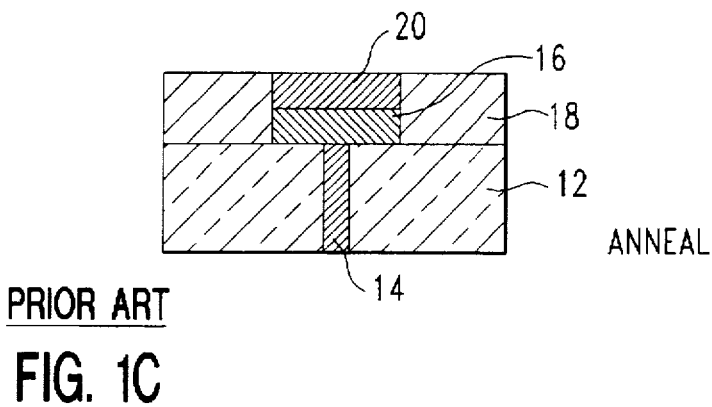
Figure 1D:
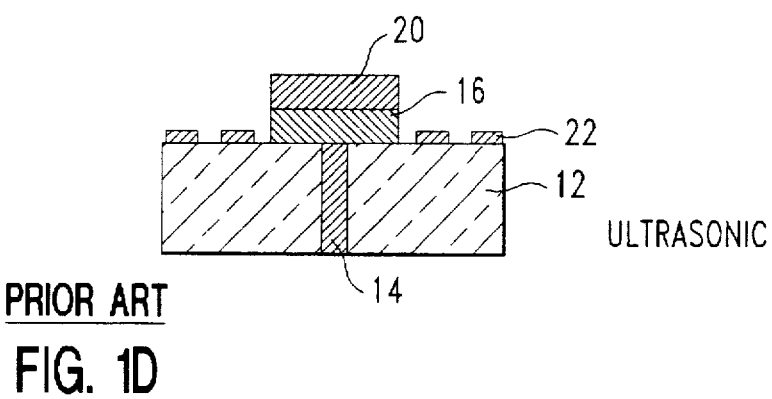

Thereafter, the ceramic substrate 10 with the layer of nickel 18 is annealed, e.g., at a temperature of about 860 degrees Centigrade in forming gas (a mixture of $N_2+H_2$), in order to diffuse the nickel into the metallic feature. As shown in FIG. 1C, portion 20 of nickel layer 18 becomes tightly bonded to metallic feature 16 as a result of the diffusion treatment.

After cooldown to room temperature, the ceramic substrate 10 with the layer of nickel 18 and tightly bonded portion 20 undergo an ultrasonic treatment, which may consist of merely placing the ceramic substrate 10 in a tank of water and applying ultrasonic energy thereto. As a result of the ultrasonic treatment, layer of nickel 18, except for tightly bonded portion 20, is removed from the ceramic substrate 10. The result is a ceramic body 12 having patterned metallurgy 16, 20 (FIG. 1D) which is produced without the need of a mask.

The present inventors have found, however, that the method of depositing the layer of metallurgy, namely evaporation or sputtering (or similar methods), causes the metallurgy to somewhat adhere to the ceramic body 12 so that even after the ultrasonic treatment, some remnants 22 of the layer of nickel 18 actually remain on the surface of the ceramic body 12. Such remnants 22 are undesirable as they can lead to shorts or other defects.

In order to prevent the presence of such remnants 22, the inventors have proposed the present invention as further discussed with reference to FIGS. 2 and 3.

Turning now to FIG. 2, again there is a patterned ceramic substrate 10 comprised of sintered ceramic body 12, metallic feature 16 and optional via 14. Metallic feature 16 may be, for example, a via, a capture pad or an I/O pad. There will usually be a plurality of such metallic features.

Figure 2A:
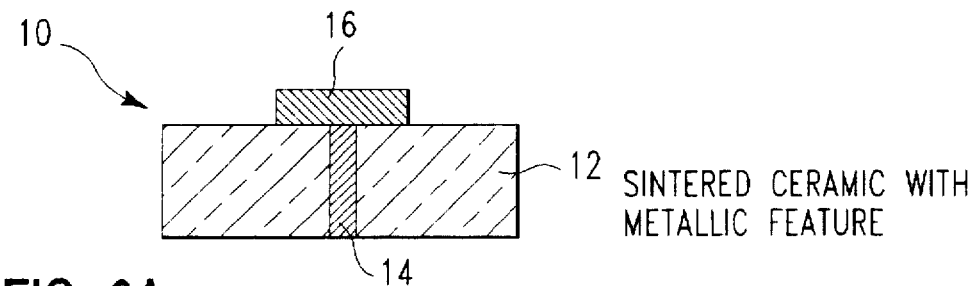
FIGS. 2A, 2B, 2C and 2D schematically illustrate a first embodiment of the present invention of a maskless method of depositing a patterned layer of metallurgy on a ceramic substrate.

For purposes of discussion, the ceramic substrate is alumina and the metallurgy is molybdenum although those skilled in the art will recognize that the teachings of the present invention apply to other ceramic materials as well as to other appropriate metallurgies. For example, the ceramic material may be (in addition to alumina) alumina plus glass, glass ceramic, glass plus ceramic, aluminum nitride, to name a few. The metallurgy may be (in addition to molybdenum) tungsten, copper, silver, palladium, to name a few. The sintered ceramic substrate 10 in FIG. 2A is ready to receive a layer of metallurgy.

Figure 2B:
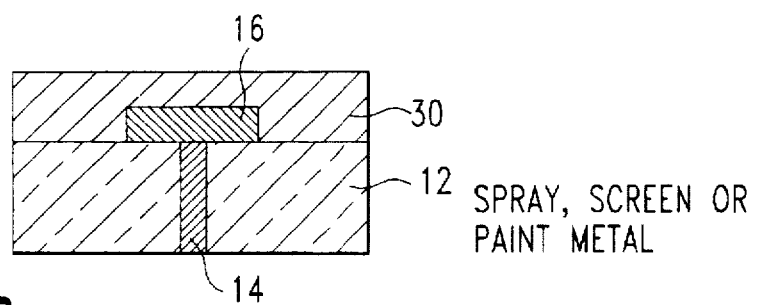

As shown in FIG. 2B, metallic mixture layer 30 is blanket applied to ceramic body 12. The thickness of metallic mixture layer 30 is in the approximate range of 0.5 to 1 mil. However, where previously a layer of metal was deposited, in the present invention, metallic mixture layer 30 is comprised of metallic material and a binder. The metallic material is preferably either elemental nickel particles or elemental copper particles or copper/nickel alloy particles or mixtures of copper and nickel particles. Preferred alloys or mixtures of copper and nickel comprise, in weight percent, 60 to 90% copper and 40 to 10% nickel. It should be understood, however, that other metals in addition to those mentioned above may be used in the present invention as will be apparent to those skilled in the art. As an example, small amounts of gold or silver maybe added to the copper or nickel.

The mixture of materials that makes up metallic mixture layer 30 is preferably applied by a method that is consistent with the mixture of materials. Such application may be by spraying, screening or painting the mixture of materials onto the ceramic body 12.

Figure 2C:
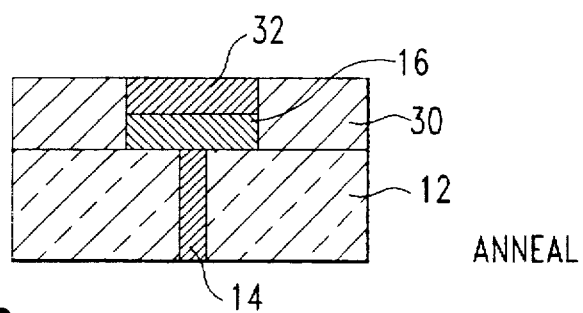

Thereafter, the ceramic substrate 10 with metallic mixture layer 30 is annealed such as at 960 to 1000 degrees Centigrade in forming gas or hydrogen. The anneal causes the metallic material of the metallic mixture layer 30 to diffuse into the metallic feature 16 but does not cause adherence to the ceramic body 12. Additionally, any organic material in the metallic mixture, such as the binder, solvents, etc., is removed during the anneal. If a copper/nickel alloy or mixture, or copper, is utilized for the metallic mixture layer 30, it will be desirable to precede the anneal with a binder burnoff step at about 700–800 degrees Centigrade in wet forming gas or wet hydrogen to remove any residual carbon. Removal of residual carbon is not a problem if elemental nickel is used as the layer of metallurgy 30. As shown in FIG. 2C, portion 32 of layer of metallurgy 30 is tightly bonded to metallic feature 16.

Figure 2D:
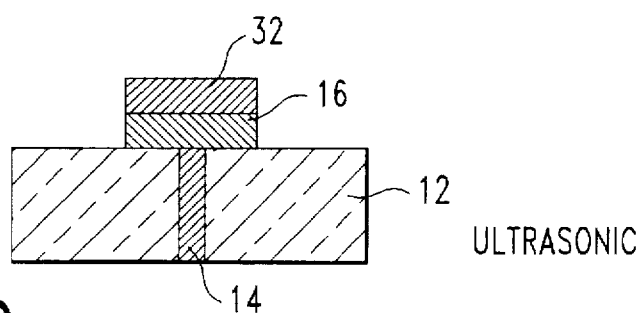

Lastly, ceramic substrate 10 now with layer of metallurgy 30 and tightly bonded portion 32 are caused to undergo an ultrasonic treatment, e.g., immersion in a tank of water to which an ultrasonic source is coupled, which causes portions of the layer of metallurgy 30 which are not tightly bonded to the metallic feature 16 to spall off. The result is ceramic substrate 10 having a ceramic body 12 and patterned metallurgy which consists of tightly bonded portion 32 of layer of metallurgy 30 and metallic feature 16 as shown in FIG. 2D. Tightly bonded portion 32 of layer of metallurgy 30 should have a resulting thickness of about 6–20 microns.

A second embodiment of the present invention is illustrated in FIGS. 3. The first embodiment of the invention, as illustrated in FIGS. 2. is directed at applying a metallic mixture layer to a ceramic substrate that has already been sintered. The second embodiment of the invention is directed to applying a metallic mixture layer to the ceramic substrate before it is sintered.

Figure 3A:
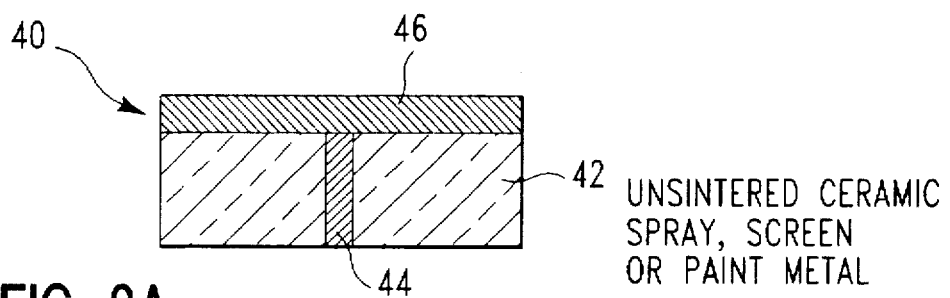
FIGS. 3A, 3B and 3C schematically illustrate a second embodiment of the present invention of a maskless method of depositing a patterned layer of metallurgy on a ceramic substrate.

Turning now to FIG. 3A, there is shown an unsintered ceramic substrate 40, which may be, for example, a greensheet or a plurality of stacked greensheets. The unsintered patterned ceramic substrate 40 comprises an unsintered ceramic body 42 having at least one metallic feature 44, in this case a via. Metallic feature 44 could also have been a capture pad or an I/O pad. Also, there may be a plurality of metallic features 44. A layer 46 of a metallic mixture is blanket coated on the unsintered ceramic substrate 40. The thickness of layer 46 of the metallic mixture is in the approximate range of 0.5 to 1 mil. The metallic mixture comprises metallic material and a binder material. Layer 46 of the metallic mixture is comprised of metallic material and a binder. The metallic material is preferably either elemental nickel particles or elemental copper particles or copper/nickel alloy particles or mixtures of copper and nickel particles. Preferred alloys or mixtures of copper and nickel comprise, in weight percent, 60 to 90% copper and 40 to 10% nickel. Again, it should be understood that other metals in addition to those mentioned above may be used in the present invention as will be apparent to those skilled in the art. As an example, small amounts of gold or silver may be added to the copper or nickel.

In this second embodiment of the invention, the choice of materials for the ceramic body 42 and metallic feature 44 is somewhat limited since the ceramic body 42 is sintered at the same temperature as the layer 46 of the metallic mixture. Such sintering criteria necessarily exclude refractory ceramic materials such as alumina and refractory metallurgies such as molybdenum or tungsten. The ceramic material may be, for example, glass ceramic or alumina plus glass. The metallurgy for the metallic feature may be, for example, copper, silver or silver/palladium.

The mixture of materials that makes up the metallic mixture layer 46 is preferably applied by a method that is consistent with the mixture of materials. Such application may be by spraying, screening or painting the mixture of materials onto the unsintered ceramic substrate 40.

Figure 3B:
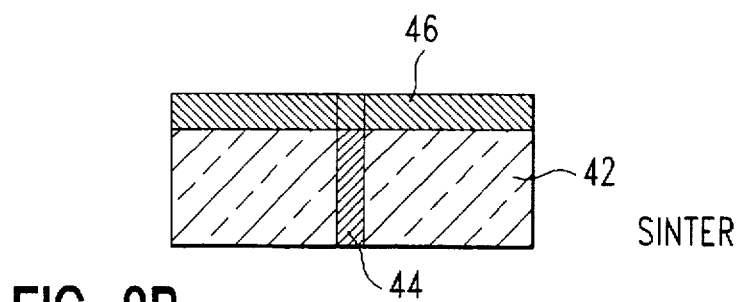

Thereafter, the unsintered ceramic substrate 40 with metallic mixture layer 46 is sintered at a temperature sufficient to cause densification of the ceramic and metallic materials in the ceramic body 42 and metallic feature 44 and layer 46, respectively. A suitable atmosphere should be chosen to protect the ceramic and metallic materials during the sintering cycle. The choice of sintering temperature and atmosphere are readily within the knowledge of those skilled in the art and will depend on the ceramic and metallic materials chosen. During the sintering cycle, the metallic material of the metallic mixture layer 46 densifies and also diffuses into the metallic feature 44 but does not adhere to the ceramic body 42. Any organic material in the metallic mixture is removed during the sintering cycle. As shown in FIG. 3B, portion 48 of layer 46 is tightly bonded to metallic feature 44.

Figure 3C:
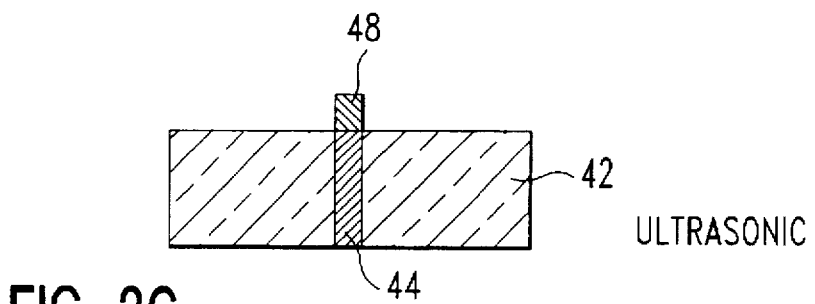

Lastly, ceramic substrate 40 now with layer of metallurgy 46 and tightly bonded portion 48 are caused to undergo an ultrasonic treatment, e.g., immersion in a tank of water to which an ultrasonic source is coupled, which causes portions of the layer 46 of metallurgy which are not tightly bonded to the metallic feature 44, to spall off. The result is ceramic substrate 40 having a ceramic body 42 and patterned metallurgy which consists of tightly bonded portion 48 of layer of metallurgy 46 and metallic feature 44 as shown in FIG. 3C. Tightly bonded portion 48 of layer of metallurgy 46 should have a resulting thickness of about 6–20 microns.

The purposes and advantages of the present invention will become more apparent after referring to the following Examples.

EXAMPLES

Example 1

A sintered alumina substrate having molybdenum top surface metallurgy, vias, wiring layers and I/O pads was utilized for this Example 1. A blanket layer of paste was screen printed onto the sintered substrate and the patterned I/O pads. The thickness of the screened layer was 25 microns. The paste consisted of, by weight based on the weight of the metallic particles, 80% copper particles and 20% nickel particles, plus additional organic paste ingredients such as ethyl cellulose binder, Texanol solvent, plasticizers and other rheological control agents. The metallic particles' mean size for the copper was 6.0 microns and the nickel particles was 4.1 microns. The screened part was fired in a forming gas atmosphere at 980 degrees Centigrade for one hour. The thickness of the metallic layer after firing was 10–12 microns. Following firing, the sintered part was addressed at close range with an ultrasonic horn immersed in water. The metallic material over the ceramic portion of the substrate was easily removed while the metallic material over the I/O pads was tightly bonded to the I/O pads. Thereafter, pins were bonded to the I/O pads using CuSil eutectic braze. The quality of the I/O pads with the metallic material was found to be excellent as evidenced by successful brazing, fillet geometry and pin pull data.

Example 2

A sintered substrate similar to that utilized in Example 1 was used in this Example 2 except that the metallic material in the metallic mixture layer was all nickel and was applied to the top surface metallurgy which in this case was controlled collapse chip connection pads, commonly referred to in the art as C-4 pads. The processing of the coated substrate was the same as in Example 1 except that the sintered part was also bead blasted following the ultrasonic treatment. Bead blasting is not necessarily required but is desired because it reduces porosity in the pad and helps define pad edge. The quality of the C-4 pads with the metallic material was excellent as evidenced by successful solder join and wettability testing.

Example 3

A plurality of glass-ceramic greensheets, such as those disclosed in Knickerbocker et al. U.S. Pat. No. 5,260,519, the disclosure of which is incorporated by reference herein, having copper vias and wiring lines were formed, stacked and laminated to form a greensheet laminate. Composite vias, i.e., mixtures of copper and glass-ceramic or glass, may also be used in all or some of the greensheets as taught in Knickerbocker et al. A blanket layer of paste was screened onto the top layer of the laminate. The paste consisted of, by weight based on the weight of the metallic particles, 80% copper and 20% nickel, plus additional organic paste ingredients such as ethyl cellulose binder, Texanol solvent, plasticizers and other rheological control agents. The metallic particles' mean size for the nickel particles was 4.1 microns and 6.0 microns for the copper particles.

The coated laminate was sintered according to the following schedule. The temperature was ramped up to about 725 degrees Centigrade in an atmosphere of wet nitrogen followed by binder burnoff in a steam ambient. Subsequently, the atmosphere was replaced with a forming gas atmosphere and then the temperature was ramped up to 975 degrees Centigrade. The atmosphere was then changed to a steam ambient and heating at 975 degrees Centigrade continued. The laminates were then cooled down, first in the steam ambient and then in nitrogen.

The thickness of the metallic layer after firing was 10–12 microns. Following firing, the sintered part was addressed at close range with an ultrasonic horn immersed in water. The metallic material over the ceramic portion of the substrate was easily removed while the metallic material over the vias was tightly bonded to the vias and had the same diameter as the vias. There was excellent adhesion between the metallic material and the vias.

It should be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of selectively depositing a metallic layer on at least one metallic feature on a ceramic substrate, the method comprising the steps of:

blanket coating a layer of a metallic mixture on said ceramic substrate and said at least one metallic feature, said metallic mixture comprising metallic material and a nonmetallic binder material;

heating said coated ceramic substrate to diffusion bond said metallic material of said metallic mixture to said at least one metallic feature, said heating occurring at a temperature high enough to cause said diffusion bond but not so high as to cause melting of said metallic material of said metallic mixture, said metallic material being loosely bonded to said ceramic substrate;

cooling said coated ceramic substrate; and ultrasonically removing said metallic material from said ceramic substrate but not from said at least one metallic feature, thereby resulting in a layer of metallic material being selectively deposited only on said at least one metallic feature.

2. The method of claim 1 wherein said metallic material is selected from the group consisting of elemental nickel particles, elemental copper particles, a mixture of copper and nickel particles, and copper/nickel alloy particles.

3. The method of claim 1 wherein said step of blanket coating is by spraying, screening or painting said metallic mixture on said ceramic substrate.

4. The method of claim 1 wherein said ceramic substrate comprises alumina and said at least one metallic feature comprises a refractory metal.

5. The method of claim 1 wherein said ceramic substrate comprises a glass-ceramic material and said at least one metallic feature comprises copper.

6. The method of claim 2 wherein said copper/nickel alloy comprises, in weight percent, 60–90% copper and 40–10% nickel.

7. The method of claim 2 wherein said mixture of copper and nickel particles comprises, in weight percent, 60–90% copper and 40–10% nickel.

8. The method of claim 1 wherein the resulting layer of metallic material has a thickness of about 6–20 microns.

9. The method of claim 1 wherein said at least one metallic feature is a via.

10. The method of claim 1 wherein said at least one metallic feature is a capture pad.

11. A method of selectively depositing a metallic layer on at least one metallic feature on a ceramic substrate, the method comprising the steps of:

blanket coating a layer of a metallic mixture on an unsintered ceramic body having at least one metallic feature, said metallic mixture comprising metallic material and a nonmetallic binder material;

sintering said coated ceramic body so that said ceramic body, said at least one metallic feature and said metallic mixture densifies into a ceramic substrate having said metallic material of said metallic mixture bonded to said at least one metallic feature and loosely bonded to said ceramic substrate, said heating occurring at a temperature high enough to cause densification, but not high enough to cause melting, of said metallic material of said metallic mixture;

cooling said ceramic substrate; and ultrasonically removing said metallic material from said ceramic substrate but not from said at least one metallic feature, thereby resulting in metallic material selectively deposited only on said at least one metallic feature.

12. The method of claim 11 wherein said metallic material is selected from the group consisting of elemental nickel particles, elemental copper particles, a mixture of copper and nickel particles, and copper/nickel alloy particles.

13. The method of claim 11 wherein said step of blanket coating is by spraying, screening or painting said metallic mixture on said unsintered ceramics body.

14. The method of claim 11 wherein said ceramic substrate comprises a glass-ceramic material and said at least one metallic feature comprises copper.

15. The method of claim 12 wherein said copper/nickel alloy comprises, in weight percent, 60–90% copper and 40–10% nickel.

16. The method of claim 12 wherein said mixture of copper and nickel particles comprises, in weight percent, 60–90% copper and 40–10% nickel.

17. The method of claim 11 wherein the resulting layer of metallic material has a thickness of about 6–20 microns.

18. The method of claim 11 wherein said at least one metallic feature is a via.

19. The method of claim 11 wherein said at least one metallic feature is a capture pad.

* * * * *